(12) United States Patent
Honda (10) Patent No.: US 8,093,939 B2
(45) Date of Patent: Jan. 10, 2012

(54) LEVEL SHIFT CIRCUIT AND SWITCHING CIRCUIT INCLUDING THE SAME

(75) Inventor: Yuri Honda, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/708,815

(22) Filed: Feb. 19, 2010

(65) Prior Publication Data

US 2010/0219874 A1    Sep. 2, 2010

(30) Foreign Application Priority Data

Feb. 27, 2009  (JP) ................................. 2009-046572
Nov. 30, 2009  (JP) ................................. 2009-271292

(51) Int. Cl.
  *H03L 5/00*    (2006.01)
(52) U.S. Cl. ......................................... 327/333
(58) Field of Classification Search .................. None
  See application file for complete search history.

(56) References Cited

U.S. PATENT DOCUMENTS

| | | | | |
|---|---|---|---|---|
| 4,237,423 A | * | 12/1980 | Rhodes | ............................ 327/12 |
| 5,568,068 A | * | 10/1996 | Ota et al. | ......................... 326/82 |
| 5,949,261 A | | 9/1999 | Field et al. | |
| 7,521,986 B2 | * | 4/2009 | Mitsuda | ......................... 327/530 |
| 7,742,358 B2 | * | 6/2010 | Nakai et al. | .................... 365/226 |
| 7,859,300 B2 | * | 12/2010 | Kibune | ............................ 326/33 |
| 2002/0000846 A1 | * | 1/2002 | Field et al. | ...................... 327/108 |
| 2007/0013431 A1 | * | 1/2007 | Owen | ............................ 327/333 |

FOREIGN PATENT DOCUMENTS

| JP | 11-238379 A | 8/1999 |
|---|---|---|
| JP | 2000-101403 A | 4/2000 |

OTHER PUBLICATIONS

Korean Office Action, dated Apr. 12, 2011, issued in Application No. 10-2010-0011778.

* cited by examiner

*Primary Examiner* — Lincoln Donovan
*Assistant Examiner* — Khareem E Almo
(74) *Attorney, Agent, or Firm* — Sughrue Mion, PLLC (57) ABSTRACT

The level shift circuit that converts a level of an input signal into a level between a first and a second voltage, which is higher than the first voltage includes a select circuit that generates an oscillation signal, where at least a frequency or an amplitude of the oscillation signal changes according to an input signal, a filter circuit that removes a DC component of the oscillation signal output from the select circuit and outputs an AC component, a detect circuit that operates between the first voltage and an output side voltage of the filter circuit, and generates a control signal including a signal voltage that changes according to at least a frequency or an amplitude of the AC component of the oscillation signal, and an output circuit that generates an output signal having a level between the first voltage and the second voltage according to the control signal.

12 Claims, 7 Drawing Sheets

LEVEL SHIFT CIRCUIT AND SWITCHING CIRCUIT INCLUDING THE SAME

INCORPORATION BY REFERENCE

This application is based upon and claims the benefit of priority from Japanese patent application Nos. 2009-046572, filed on Feb. 27, 2009, and 2009-271292, filed on Nov. 30, 2009, the disclosures of which are incorporated herein in its entirety by reference.

BACKGROUND

1. Field of the Invention

The present invention relates to a level shift circuit.

2. Description of Related Art

Figure 6:
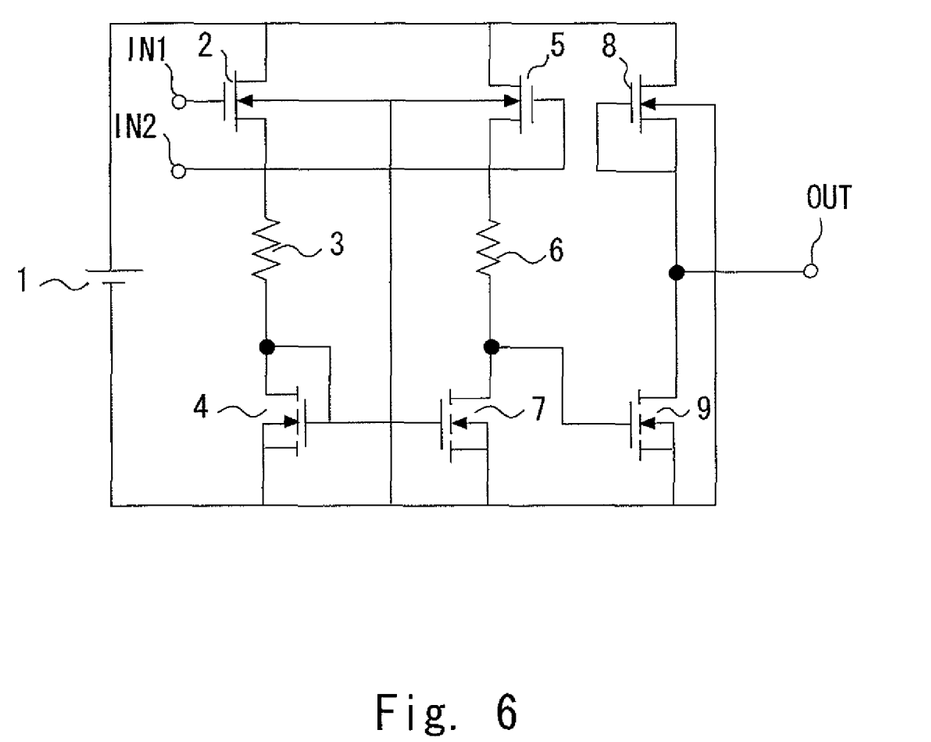
FIG. 6 is a circuit diagram illustrating an example of the configuration of a level shift circuit according to a related art.

Heretofore, a level shift circuit that converts a voltage level of an input signal to generate an output signal is well known in the art. FIG. 6 illustrates the configuration of the circuit disclosed in Japanese Unexamined Patent Application Publication No. 2000-101403. It is assumed that the input terminal IN1 is a ground power supply voltage GND, the input terminal IN2 is an input voltage Vin, the minus voltage of the power supply voltage 1 is a negative power supply voltage BCP, and a plus side voltage is a positive power supply voltage VDD. When a value of a current flowing into a first current path composed of the transistor 2, the resistor 3, and the transistor 4 is referred to as IREF1, the current IREF1 can be represented by the following equation.

$$IREF1 = \frac{0 - \left(VT + \sqrt{\frac{2IREF1}{\beta}}\right) - BCP}{R3}$$

$$\beta = \mu nCox \frac{W}{L}$$

$W$ = channel width, $L$ = channel length

Further, if $\beta$ is large enough, the above equation can be represented by the following equation.

$$IREF1 = \frac{-VT - BCP}{R3}$$

If the transistors 4 and 7 form an ideal current mirror, a gate potential of the transistor 9 can be represented by the following equation.

$$V_{IE9} = Vin - \frac{R6}{R3}(-VT - BCP)$$

The threshold of the input voltage Vin of the transistor 9 is represented by the following equation.

$$V_{IE9} - BCP = VT$$

$$Vin - \frac{R6}{R3}(-VT - BCP) - BCP = VT$$

If the values of the resistors 6 and 3 are specified to be equal, the threshold in which the transistor 9 is turned on and off is;

$$Vin = 0$$

This value does not depend on the negative power supply voltage BCP. Accordingly, the voltage of the output terminal OUT for the input terminal IN2 is;

$$Vout(Low) = BCP$$

$$Vout(High) = VDD$$

Thus a desired operation can be achieved.

Figure 7:
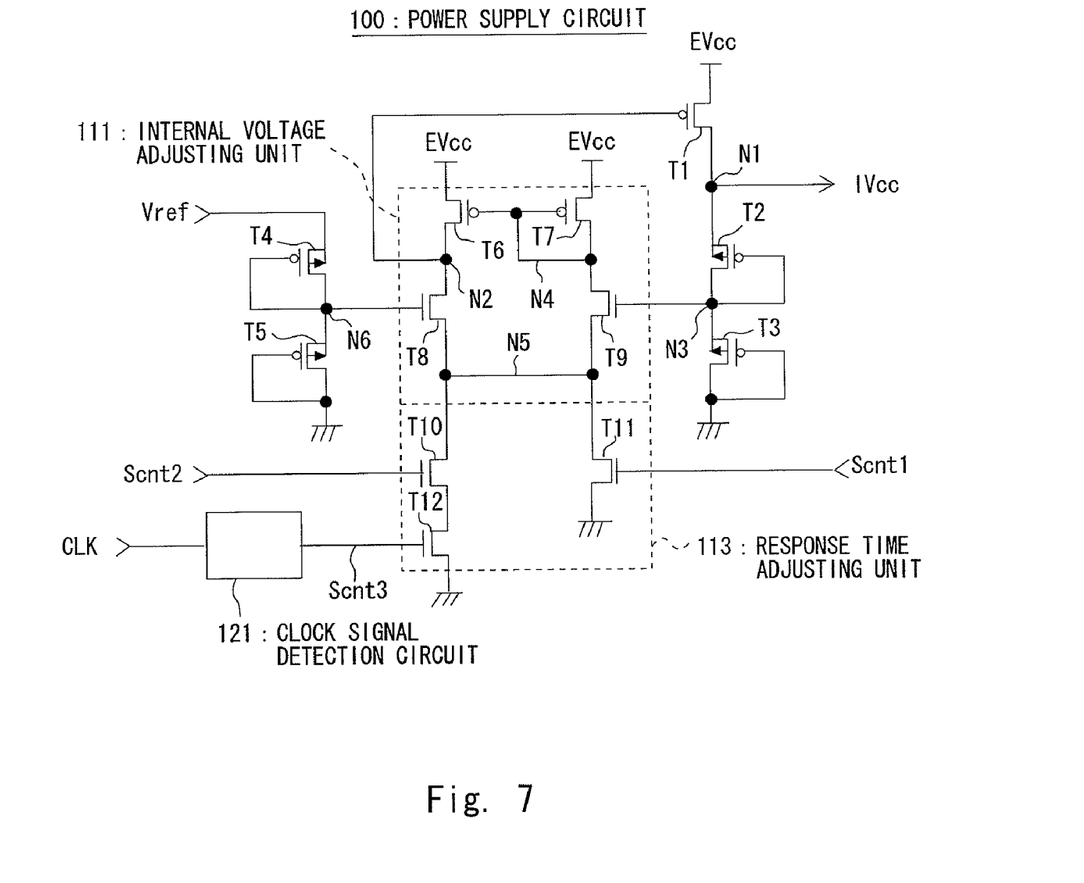
FIG. 7 is a circuit diagram illustrating another example of the configuration of a level shift circuit according to a related art.

FIG. 7 illustrates a circuit disclosed in Japanese Unexamined patent application Publication No. 11-238379. This circuit is capable of adjusting an internal voltage. A power supply circuit 100 includes an internal voltage adjusting unit 111, a response time adjusting unit 113, a P channel transistor T1 as a voltage conversion unit, P channel transistors T2, T3, T4, and T5, and a clock signal detection circuit 21. In this circuit, the external voltage EVcc is converted into the internal voltage IVcc, which is specified by the reference voltage Vref. Even if the internal voltage fluctuates, the internal voltage adjusting unit 111 compensates the fluctuation.

Note that the response speed of the internal voltage adjusting unit for the fluctuation of the internal voltage can be adjusted by the response speed time adjusting unit 113. In response to a clock signal CLK, the clock signal detection circuit 121 activates an N channel type transistor T12 and increases the response speed of the internal voltage adjusting unit 111.

SUMMARY

The present inventor has found a problem that in the circuit disclosed in Japanese Unexamined Patent Application Publication No. 2000-101403, the path composed of the transistor 2, the resistor 3, and the transistor 4 is always turned on, and thus consumes large power. The value of the current flowing this path is IREF1. If VT=0.2V and BCP=−7 approximately, the resistance R3 is 1 Mohm and IREF1=6.8 uA. Further, if the transistors 4 and 7 form an ideal current mirror, the same current will flow into the path composed of the transistor 5, the resistor 6, and the transistor 7. Accordingly, in the circuit disclosed in Japanese Unexamined Patent Application Publication No. 2000-101403, the current of a total of 13.6 uA always continues to flow.

When the negative power supply voltage is generated by a charge pump circuit, the current IREF1 always flows into the charge pump circuit. The charge pump adjusts the negative power supply voltage BCP that fluctuates according to the incoming current to be a predetermined voltage. Therefore, the charge pump circuit is greatly loaded, and the power consumption in the charge pump circuit becomes large.

For example, in the case that a circuit includes four level shift circuits disclosed in Japanese Unexamined patent application Publication No. 2000-101403 to form four outputs, even if the IREF1 path is shared, the current of 34 uA continues to flow into the charge pump circuit.

Moreover, in the circuit disclosed in Japanese Unexamined patent application Publication No. 11-238379, a current flows into the path through the transistors T1 to T3, the path through the transistors T6, T8 and T11, and the path through the transistors T7, T9 and T11. If L level of the output signal is the negative power supply voltage BCP, there is a problem that a current flows into the charge pump circuit that generates the negative power supply voltage BCP from the abovementioned paths, as with Japanese Unexamined patent application Publication No. 2000-101403, and large power is consumed by the charge pump circuit.

An exemplary aspect of an embodiment of the present invention is a level shift circuit that converts a level of an input signal into a level between a first voltage and a second voltage which is higher than the first voltage. The level shift circuit includes a select circuit that generates an oscillation signal according to the input signal, where at least one of a frequency and an amplitude of the oscillation signal changes, a filter circuit that removes a DC component of the oscillation signal output from the select circuit and outputs an AC component, a detect circuit that operates between the first voltage and an output side voltage of the filter circuit and generates a control signal having a signal voltage that changes according to a change of at least one of the frequency and the amplitude in the AC component of the oscillation signal, and an output circuit that generates an output signal according to the control signal, the output signal having a level between the first voltage and the second voltage.

In the level shift circuit according to the present invention that converts an input signal into a different signal level, for the oscillation signal having at least the frequency or the amplitude being adjusted according to the input signal, the filter circuit filters out the DC component, and the detect circuit detects that the frequency or the amplitude is switched in the remaining AC component. Then the level of the input signal can be transmitted to the subsequent output circuit by the AC component while filtering out the DC component flowing from the power supply voltage that drives the select circuit into the first voltage, thereby enabling to generate the output signal with its level shifted by the output circuit. Thus, if the first voltage is generated by the charge pump circuit, for example, a current will not always flow into the charge pump circuit, a less burden is imposed on the charge pump circuit and thereby enabling to reduce the power consumption.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
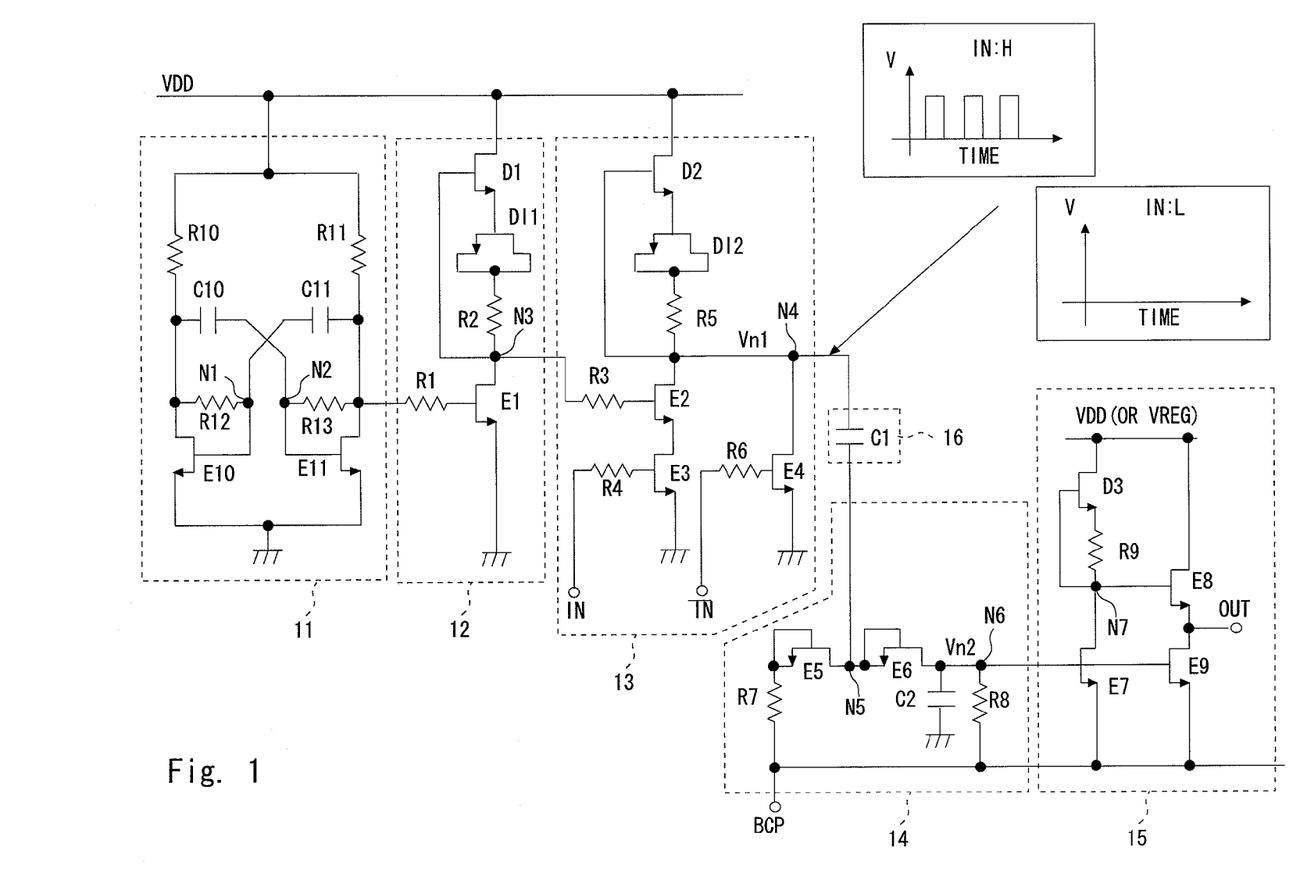
FIG. 1 is a circuit diagram illustrating an example of the configuration of a level shift circuit according to an exemplary embodiment.

Hereinafter, an exemplary embodiment of the invention is described with reference to the drawings. FIG. 1 is a circuit diagram illustrating an example of the configuration of a level shift circuit according to an exemplary embodiment of the present invention. The level shift circuit uses a negative power supply voltage BCP whose value changes. In the drawings, IN indicates an input terminal and OUT indicates an output terminal. The voltage range of a signal input to the input terminal IN is 0 to VDD[V]. The voltage range of the signal output from the output terminal OUT is BCP to VDD[V].

Three of the power supply voltages are supplied to the level shift circuit, which are a positive power supply voltage VDD, a negative power supply voltage BCP, and a ground power supply voltage GND. Hereinafter, an "E mode FET" indicates an enhancement mode FET (Field Effect Transistor). A "D mode FET" indicates a depletion mode FET. Note that the threshold of FET is referred as Vt.

The level shift circuit according to this exemplary embodiment converts an input signal voltage into a signal level between a first voltage and a second voltage. The second voltage is higher than the first voltage. The level shift circuit includes a select circuit 13 that generates an oscillation signal. At least one of a frequency or an amplitude of the oscillation signal changes according to an input signal (Vin). The level shift circuit further includes a filter circuit 16 that removes a DC component of the oscillation signal (Vn1) output from the select circuit 13 and outputs an AC component, a detect circuit 14 that operates between the first voltage and an output side voltage of the filter circuit 16, and generates a control signal (Vn2) including a signal voltage that changes according to at least one of a frequency and an amplitude of the AC component of the oscillation signal (Vn1), and an output circuit 15 that generates an output signal having a level between the first voltage and the second voltage according to the control signal.

In this exemplary embodiment, the filter circuit 16 is a capacitance C1. The first voltage is the negative supply voltage BCP, and the second voltage is the power supply voltage VDD. Note that the second voltage should only be higher than the negative power supply voltage BCP, which is the first voltage. Other than the positive power supply voltage VDD supplied externally, the second voltage may be an internal generation voltage VREG, which is generated inside the level shift circuit.

The level shift circuit illustrated in FIG. 1 is provided with an oscillator circuit 11 and a buffer circuit 12 in the previous stage of the select circuit 13. Each component is explained hereinafter.

The oscillator circuit 11 is provided with resistors R10 to R13, capacitances C10 and C11, and E mode FETs E10 and E11. As for the resistor R10, one end is connected to the positive power supply voltage VDD, and the other end is connected to a node N2 via the capacitance C10, and also connected to a drain of the E mode FET E10. As for the resistor R11, one end is connected to the positive power supply voltage VDD, and the other end is connected to a node N1 via the capacitance C11, and also connected to a drain of the E mode FET E11.

The resistor R12 is connected between the drain and a gate of the E mode FET E10. Further, the resistor R13 is connected between the drain and a gate of the E mode FET E11. Sources of the E mode FETs E10 and E11 are connected to the ground power supply voltage GND. The drain of the E mode FET E11 is connected to the subsequent stage buffer circuit 12.

In the oscillator circuit 11 composed in this way, the capacitances C10 and C11 are charged via the resistors R10 and R11, respectively. Then, if the gates of the E mode FETs E10 and E11 exceed the threshold, the E mode FETs E10 and E11 alternately turn on or off. Then the oscillator 10 oscillates in a predetermined oscillation frequency. The oscillator 10 generates and outputs an oscillation signal in this way, and the oscillation signal is input to the gate of the E mode FET E1 of the buffer circuit 12 via the resistor R1.

The buffer circuit 12 shapes a waveform output from the previous stage oscillator circuit 11. The buffer circuit 12 is provided with resistors R1 and R2, a D mode FET D1, and a diode DI1. The D mode FET D1, the diode DI1, and the resistor R2 form a constant current source. The D mode FET D1, the diode DI1, and the resistor R2 are connected in series in order from the positive power supply voltage VDD. An output side is connected to the node N3. A gate of the D mode FET D1 is connected to the node N3. Note that the reason the D1 is composed of a depletion mode FET is not to influence the operation of the oscillator circuit 11. As for the E mode FET E1, a gate is connected to the previous stage oscillator circuit 11 via the resistor R1, a source is connected to the ground power supply voltage GND, and a drain is connected to the node N3.

In the buffer circuit 12 formed in this way, the E mode FET E1 is turned on and off according to the output from the oscillator circuit 11. The voltage of the node N3 switches from between the ground power supply voltage GND and a voltage which is the positive power supply voltage reduced by the voltage drop of the constant current source (D1, DI1, and R2), according to the operation of the E mode FET E1. The voltage of the node N3 is output to the subsequent stage select circuit 13.

The voltage of the node N3 is output to a gate of the E mode FET 2 via the resistor R3 of the select circuit 13. The voltage of the node N3 shall be VclK hereinafter and described in detail later in the explanation of the operation of the level shift circuit. Note that the buffer circuit 12 is provided so that the oscillation frequency of the oscillator circuit 11 is not influenced by the connection of the subsequent stage select circuit 13 and the detect circuit 14. The buffer circuit 12 is not necessarily required for the level shift circuit according to this exemplary embodiment.

The select circuit 13 switches at least one of the frequencies or the amplitude of the oscillation signal according to a voltage level of the input terminal IN. In other words, the select circuit 13 switches the frequency or the amplitude to switch whether to output the oscillation signal to the subsequent stage detect circuit 14 or not.

Specifically, the select circuit 13 includes a first switching unit and a second switching unit. The first switching unit switches whether or not to supply a current supplied from a constant current source to the detect circuit according to the oscillation signal input to a gate. The second switching unit switches whether or not to supply a current to the first transistor according to the input signal. In FIG. 1, the first switching unit is configured with an E mode FET E2 and the second switching unit is configured with an E mode FET E3. Further, the select circuit 13 is provided with resistors R3 to R6, a D mode FET D2, a diode DI2, and a capacitance C1. The D mode FET D2, the diode DI2, and the resistor R5 form a constant current source. The D mode FET D2, the diode DI2, and the resistor R5 are connected in series in order from the positive power supply voltage VDD. A gate of the D mode FET D2 is connected to a node N4. The node N4 is connected to the ground power source voltage GND via the E mode FETs E2 and E3 that are connected in series.

The output of the previous stage buffer circuit 12 is input to the gate of the E mode FET E2. The input terminal IN is connected to the gate of the E mode FET E3 via the resistor R4. Further, the E mode FET E4 is connected between the node N4 and the ground power source voltage GND. A complementary signal of the input terminal IN is input to the gate of the E mode FET E4 via the resistor R6. That is, the E mode FETs E3 and E4 operate complementarily and if either of the E mode FET E3 or E4 is turned on, the other one is turned off.

In the select circuit 13 composed in this way, if the voltage of the input terminal IN is H level, the E mode FET E3 is turned on. Thus the voltage Vn1 of the node N4 exhibits an oscillation waveform that corresponds to the oscillation waveform of the node N3. Specifically, the oscillation waveform which appears in the voltage Vclk of the node N3 is input to the gate of the E mode FET E2 via the resistor R3.

If the voltage level of the input terminal IN is H level, the E mode FET E3 is turned on, and the source of the E mode FET E2 will almost be the ground power supply voltage GND. Therefore, the E mode FET E2 is turned on if the oscillation waveform (voltage Vclk) input to its gate is set to H level, and if the oscillation waveform is set to L level, the E mode FET E2 is turned off. Accordingly, a low potential appears in the voltage Vn1 of the node N4 if the oscillation waveform of the voltage Vclk is H level, and a high potential appears if the oscillation waveform is L level. Note that the oscillation frequency of the voltage Vn1 maintains to be the frequency of the oscillation frequency of the voltage Vclk.

On the other hand, if the voltage level of the input terminal IN is L level, the E mode FET E3 is turned off. That is, the source of the E mode FET E2 is connected to the ground power source voltage GND via a high resistance. Therefore, regardless of the voltage Vclk input from the previous stage buffer circuit 12, the E mode FET E2 is almost turned off. Thus, the voltage Vn1 of the node N4 exhibits a constant voltage, which is the positive power supply voltage VDD reduced by the voltage drop of the constant current source (D2, DI2, and R5).

Even if there is no shunt circuit that is composed of the E mode FET E4 and the resistor R6, the voltage Vn1 of the node N4 is ideally a DC voltage. However in reality as the E mode FET E2 has a gate to drain capacitance Cgd, a small-level AC waveform appears. Therefore, as illustrated in FIG. 1, it is preferable to insert a shunt circuit composed of the E mode FET E4 and the resistor R6 between the node N4 and the ground terminal.

The voltage of the node N4 is input to a filter 16 (capacitance C1). The filter 16 is connected between the node N4 of the select circuit 13 and the node N5 of the detect circuit 14. The filter 16 filters out a DC component in the oscillation signal of the node N4 and outputs only an AC component to the subsequent stage detect circuit 14. Thus, if the input terminal IN is H level, the AC component of the voltage Vn1 is output to the node N5 by the capacitance C1.

The detect circuit 14 detects whether an AC signal is included in the voltage Vn1, which is an output of the select circuit 13. In other words, the detect circuit 14 detects that at least one of the frequency or the amplitude of the signal that appears in the voltage Vn1 is switched. The detect circuit 14 is provided with a capacitance C2, E mode FETs E5 and E6, and resistors R7 and R8.

The node N5 is connected to a drain side of the E mode FET E5 and connected to the negative voltage power supply BCP via the E mode FET E5 and the resistor R7. Further, the node N5 is connected to a source side of the E mode FET E6 and to the ground power supply voltage GND via the E mode FET E6 and the capacitance C2, and also to the negative voltage power supply BCP via the E mode FET E6 and the resistor R8.

In the detect circuit 14 composed in this way, if the input terminal IN is H level, a waveform component having a potential lower than the negative power supply voltage BCP in an AC component that is input to the node N5 flows to the negative power supply voltage BCP via the E mode FET E5 and the resistor R7.

Further, if the input terminal IN is H level, a waveform component having a potential higher than the negative power supply voltage BCP in the AC component that is input to the node N5 flows into the node N6 via the E mode FET E6. The voltage of the node N6 is referred to as Vn2. The current flowing into the node N6 is smoothed by the capacitance C2 connected between the node N6 and the ground power supply voltage GND. Suppose that the voltage generated between both ends of the capacitance C2 is a DC voltage Vdet, the voltage Vn2=BCP+Vdet. The voltage Vn2 of the node N6 is output to gates of the subsequent stage E mode FETs E7 and E9.

On the other hand, if the input terminal IN is L level, the DC component of the node N4 is filtered out by the capacitance C1. Thus the node N6 is connected to the negative power supply voltage BCP via the resistor R8. Then voltage Vn2=negative power supply voltage BCP.

The output circuit 15 is provided with the E mode FETs E7 to E9, a D mode FET D3, and a resistor R9. As for the E mode FET E7, a source is connected to the negative power supply voltage BCP, a gate is connected to the node N6, and a drain is connected to the node N7. A constant current source composed of the D mode FET D3 and the resistor R9 is connected between the positive power supply voltage VDD and the node N7. Further, the gate of the D mode FET D3 is connected to the node N7. As for the E mode FET E9, a source is connected to the negative power supply voltage BCP, a gate is connected to the node N6, and a drain is connected to the output terminal OUT. Further, as for the E mode FET E8, a source is connected to the output terminal OUT, a gate is connected to the node N7, and a drain is connected to the positive power supply voltage VDD.

In the output circuit 15 composed in this way, if the input terminal IN is H level and the relationship between the voltage Vdet that generates between the both ends of the capacitance C2, a threshold $Vt_{E7}$ and $Vt_{E9}$ of the E mode FETs E7 and E9 satisfies;

$$Vdet > Vt_{E7}, Vt_{E9}$$

the E mode FETs E7 and E9 are turned on. Then, the potential of the node N7 becomes the negative voltage power source BCP. Therefore, the voltage of the node N7 is input to the gate of the E mode FET E8 to turn off the E mode FET E8. Accordingly, a BCP voltage appears in the output terminal OUT.

On the other hand, if the input terminal is L level, the voltage Vn2 is connected to the negative power supply voltage BCP via the resistor R8, Vn2=BCP. Thus both of the E mode FETs E7 and E9 are turned off. Then the potential of the node N7 becomes almost the positive supply voltage VDD, and the E mode FET E8 is turned on. As a result, a positive supply voltage VDD appears in the output voltage OUT.

Figure 2:
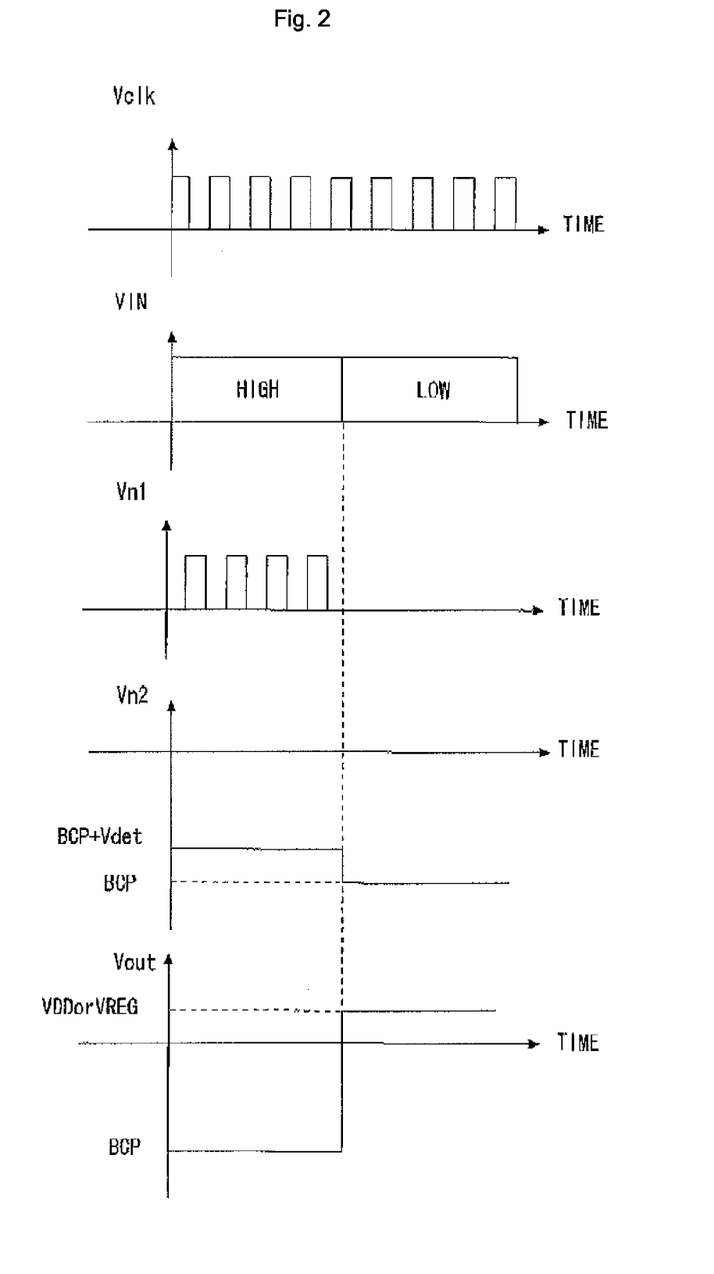
FIG. 2 illustrates an operation of the level shift circuit according to the exemplary embodiment.

Next, an operation of the entire level shift circuit composed in this way is explained with reference to FIG. 2. FIG. 2 illustrates voltage waveforms in each of the node in the level shift circuit according to this exemplary embodiment. The oscillation waveform is output from the oscillator circuit 11. Although this output waveform is amplified by the buffer circuit 12, the output waveform of the buffer circuit 12 is mostly the same as the output waveform of the oscillator circuit 11. The output waveform of this buffer circuit 12 appears in the voltage Vclk of the node N3.

The oscillation waveform which appears in the voltage Vclk is input to the gate of the E mode FET E2 via the resistor R3. If the input terminal IN is H level, the E mode FET E3 is turned on and the source of the E mode FET E2 becomes almost the ground power supply voltage GND. Accordingly, the E mode FET E2 is turned on if the oscillation waveform input to its gate is set to H level, and turned off if the oscillation waveform is set to L level.

Accordingly, if the oscillation waveform is H level, a low potential appears in the voltage Vn1 of the node N4, and if the oscillation waveform is L level, a high potential appears. Note that the frequency of the oscillation waveform of the voltage Vn1 maintains to be the frequency of the oscillation waveform of the voltage Vclk.

[In Case Input Terminal IN is H Level]

As for the oscillation waveform which appears in the voltage Vn1 of the node N4, if the input terminal IN is H level, only the AC component is input to node N5 via the capacitance C1, and the waveform component with a potential lower than the negative supply voltage BCP flows into the negative supply voltage BCP via the E mode FET E5. The remaining waveform component with a potential higher than the negative power supply voltage BCP flows into the node N6 via the E mode FET E6. The voltage of the node N6 is smoothed by the smoothing capacitance C2 to be the direct current voltage Vdet.

Therefore, Vn2=BCP+Vdet. If $Vdet > Vt_{E7}$ and $Vt_{E9}$, the E mode FETs E7 and E9 of the output circuit 15 connected to the node N6 are turned on, respectively. By the E mode FET E7 to be turned on, the potential of the node N7 turns into a BCP potential. Accordingly, the E mode FET E8 is turned off. As a result, a BCP voltage appears in the output terminal OUT.

If the voltage Vdet that is generated between the both ends of the capacitance C2 is approximately 0.5V and R8=200 kohm, the current flowing via the capacitance C2 is 2.5 uA.

[If the Input Terminal IN is L Level]

If the input terminal IN is L level, the E mode FET E3 is turned off. Accordingly, the source of the E mode FET E2 is connected to the ground power supply voltage GND via a high resistance, and the E mode FET E2 is almost turned off regardless of the voltage Vclk of the node N3. Accordingly, a constant voltage, which is the positive power supply voltage VDD reduced by the voltage drop in the constant current source, appears in the voltage Vn1 of the node N4.

Therefore, the voltage Vn1 includes only the DC component, however the DC component in the voltage Vn1 is filtered out by the capacitance C1. Thus the voltage Vn2 is connected to the negative power supply voltage BCP via the resistor R8 and thus Vn2=BCP. At this time, the output circuits E FETs E7 and E9 are both turned off, and a contact potential between the resistor R9 and the drain terminal of E7 nearly turns into the positive power supply voltage VDD. Thus the E mode FET E8 is turned on and the positive power supply voltage VDD appears in the output voltage Vout (Vout in FIG. 2).

If the input terminal IN is L level, Vn2=BCP and the current will not flow.

In terms of the current consumption of the output circuit 15, if the voltage Vn2 of the node N6 is BCP+Vdet, the E mode FET E7 is turned on, and a current flows from the constant current source composed of the D mode FET D3 and the resistor R9 to the negative power supply voltage BCP. If the threshold of the D mode FET D3 is $Vt_{D3}$, the current value is;

$$Vt_{D3}/R9$$

Even if the resistance value R9 is made large enough, the current flowing from the constant current source composed of the D mode FET D3 and the resistor R9 to the negative power supply voltage BCP is a few uA to some dozen uA.

Next, the effect of the level shift circuit composed in this way is explained hereinafter. In the operation for the output voltage Vout to switch for the input voltage Vin, the current value flowing into the negative power supply voltage BCP terminal as a DC component excluding the current flowing into the negative power supply voltage BCP terminal from the output circuit 15, is Vn2=BCP=Vdet at H level of the input terminal. The current that flows into the capacitance C2 at this time is Vdet/R8.

Next, the case is explained, in which the negative supply voltage BCP is supplied from the charge pump circuit. The current consumption value of the charge pump circuit is calculated by a fixed multiple of the current value flowing into the negative power supply voltage BCP by the number of stage in the charge pump circuit. The current consumption value of the charge pump circuit can be a big problem when attempting to reduce the current consumption.

Therefore, the current is considered hereinafter that flows from the constant current source composed of the D mode FET D3 and the resistor R9 to the negative power supply voltage BCP if the voltage Vn2 of the node N6 is BCP+Vdet. If the voltage Vn2 of the node N6 is BCP+Vdet, the potential of the node N7 is the BCP potential, and the E mode FET E8 is turned off. Thus the current flowing into the resistor R9 is not limited to be provided by the positive power supply voltage VDD as long as a terminal has the potential of the BCP voltage.

Figure 3:
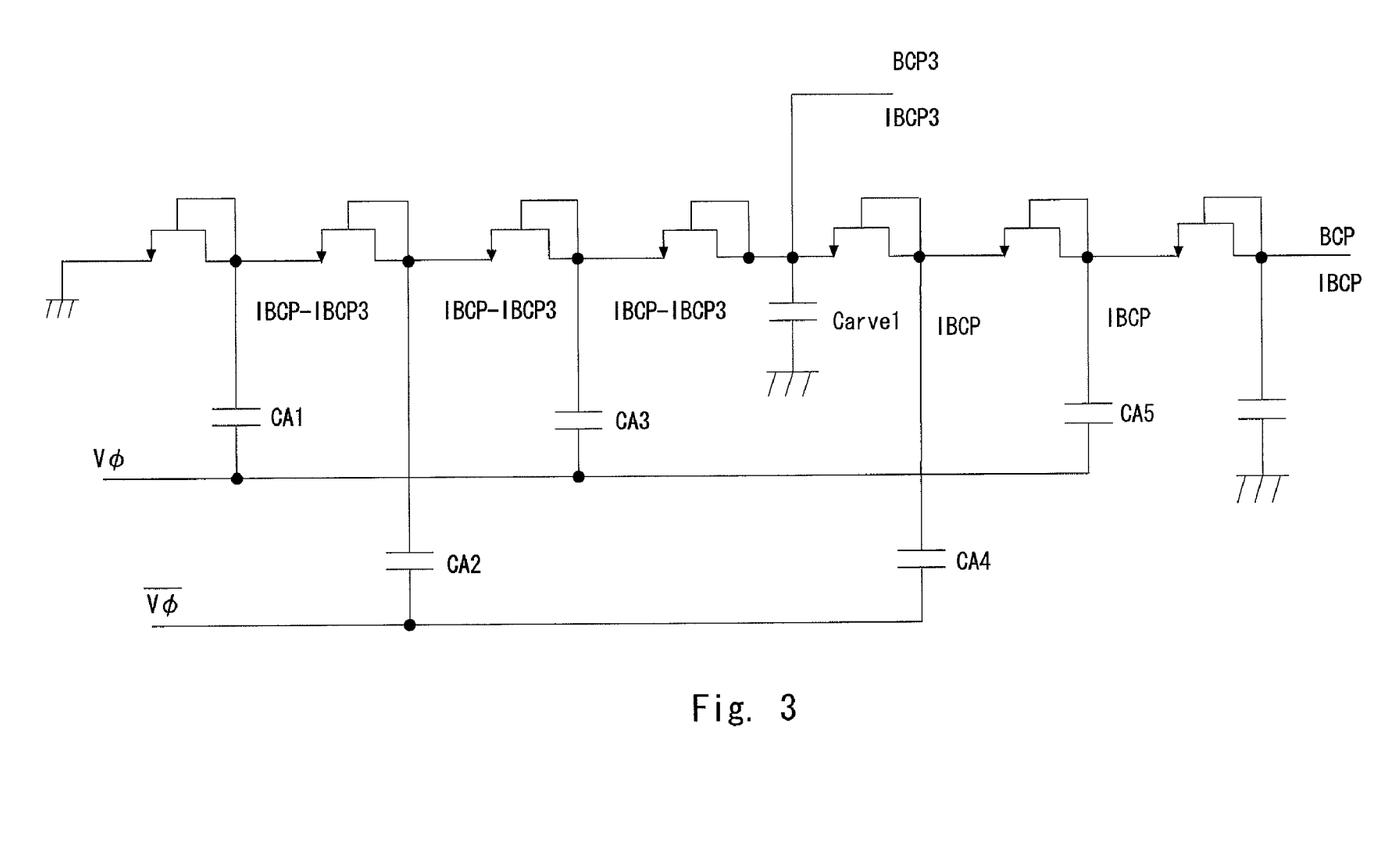
FIG. 3 is a circuit diagram illustrating an example of the configuration of a BCP generation circuit according to the exemplary embodiment.

To be more specific, as illustrated in FIG. 3, a smoothing circuit is provided in the intermediate stage of the charge pump circuit that generates a voltage supplied from the negative power supply voltage BCP. Suppose that the potential is BCP3, BCP3>BCP. Thus it can be seen that this terminal may flow the current flowing into the resistor 9. If the current value flowing into the BCP terminal is IBCP and the current value flowing from the BCP3 is IBCP3, as illustrated in FIG. 3, a negative current value of the booster circuit, that is, disposed to the left side of the BCP3 terminal when viewed from the GND terminal, is IBCP-IBCP3. Accordingly, the current consumption value of the charge pump circuit in FIG. 3, for example, is;

$$3 \times (IBCP-IBCP3)+2 \times IBCP$$

Thus the current value can be smaller than the current value 5×IBCP when the BCP3 terminal is not provided. Further, in other words, as the load current value can be made smaller, an absolute value of the output voltage can be larger by the booster circuit characteristic, which is briefly indicated by the following equation.

$$BCP = -N \times \left( VDD - Vt - \frac{Iout}{C \times F} \right) + VF$$

$N$ = number of boost step, $Vt$ = threshold of switching element, $Iout$ = load current, $C$ = pressure up capacity, $F$ = number of oscilation The level shift circuit of this exemplary embodiment formed in this way that converts an input signal into a different signal level, converts an oscillation signal (Vn1) having at least one of a frequency or an amplitude adjusted according to an input signal (Vin) into an AC signal by a filter (capacitance C1). The detect circuit detects that the frequency or the amplitude is switched according to the AC signal. Then the signal level of the input signal is transmitted to a subsequent stage output circuit by the AC signal while filtering out a DC current flowing from the power supply voltage (VDD) that drives the select circuit 13 to the first voltage (BCP), so that an output signal with level shifted can be generated.

Further, as there is no current that always flows from the power supply voltage (Vdd) to the first voltage (BCP), no burden is imposed on the charge pump circuit that generates the first voltage (BCP) and thereby enabling to reduce the power consumed by the charge pump circuit.

As described above, in the level shift circuit according to this exemplary embodiment, the output terminal OUT can be switched to L/H level with low current consumption. Further, since there is no component element that requires a large chip area, the level shift circuit can be miniaturized.

Note that the output circuit 15 is not limited to the circuit configuration of FIG. 1, but may be any configuration as long as the output voltage is switched by L/H of the input voltage Vin using the negative power supply voltage BCP as a reference voltage. Further, the first voltage is not limited to the negative power supply voltage BCP but may be any voltage level.

[Application Example]

Figure 4:
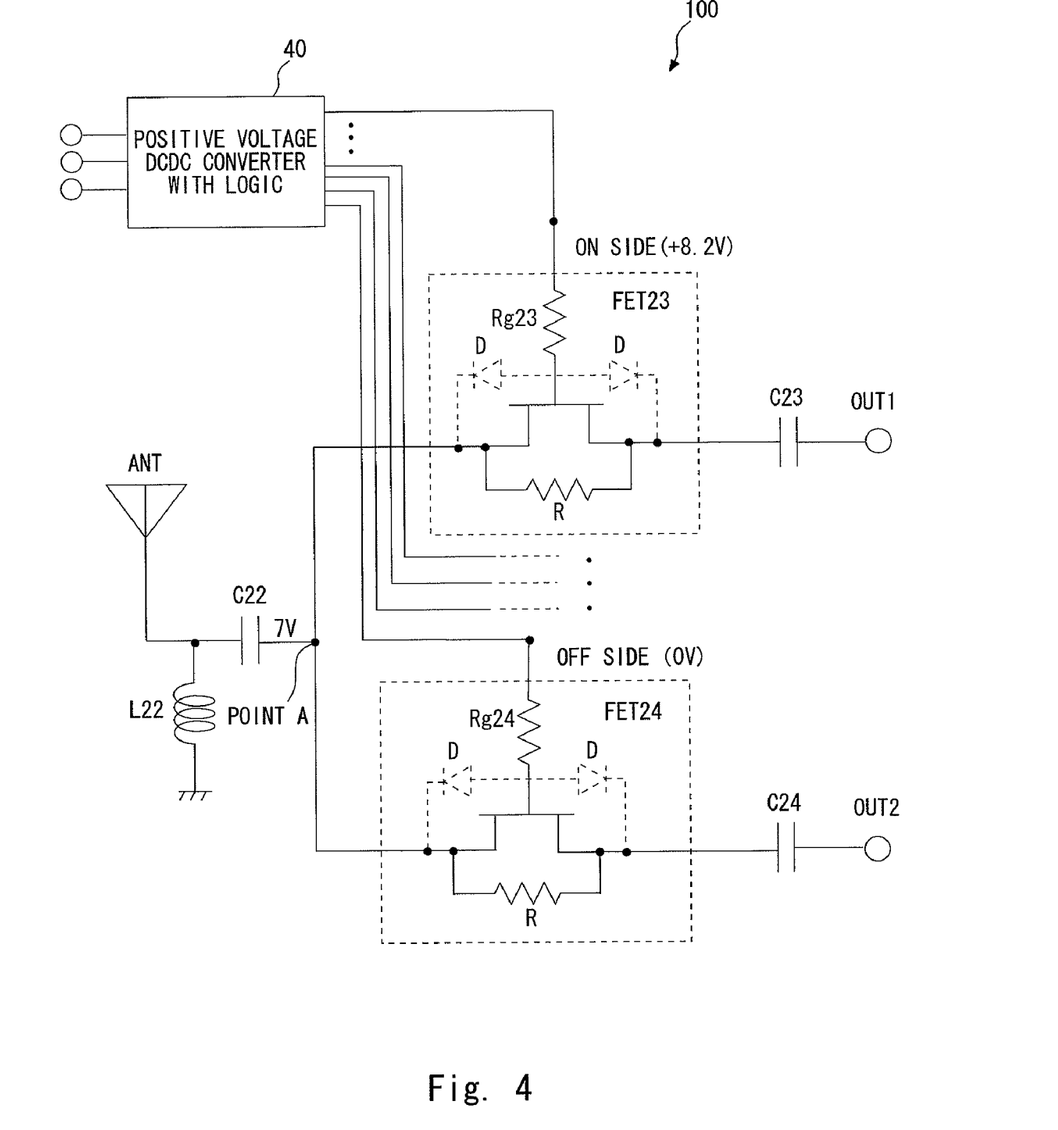
FIG. 4 illustrates the configuration of a switching circuit incorporating the level shift circuit of the exemplary embodiment to a positive voltage DCDC converter.

Next, an application example of the level shift circuit according to this exemplary embodiment is explained. FIG. 4 illustrates the configuration of a switching circuit incorporating the level shift circuit of this exemplary embodiment. In a switching circuit 100, a signal received by an antenna (input terminal) ANT is input to a point A via a high pass filter composed of a capacitor C22 and an inductor L22. The signal of this point A is output to the output terminals OUT1 and OUT2 via multiple FET switches. In other words, the signal input by the antenna (input terminal) ANT is output from the output terminals OUT1 and OUT2 selectively by the FET switches.

The switching circuit 100 is provided with a positive voltage DCDC converter with logic 40 and multiple FET switches. The positive voltage DCDC converter with logic 40 controls ON/OFF of the multiple FET switches composed of FET 23 and FET 24. The positive voltage DCDC converter with logic 40 is provided with the level shift circuit (not illustrated) according to the exemplary embodiment of the present invention. The level shift circuit generates a control signal that controls ON/OFF of the multiple FET switches.

If the level shift circuit is configured so that a 3 bits input signal is input to the positive voltage DCDC converter with logic 40, 8 switches that are controlled to be ON/OFF by the 3 bits input signal can be connected. Note that the number of the input signal and the switch can be specified as appropriate. FIG. 4 illustrates the case in which the FET 23, that includes a gate resistor Rg 23 connected to a gate and a resistor connected between a source and a drain, is turned on, and the FET 24, that includes a gate resistor Rg 24 connected to a gate and a resistor connected between a source and a drain, is turned off, among the multiple FET switches.

The positive voltage DCDC converter with logic 40 which applies a voltage to gate resistance terminals of the FET 23 and FET 24 applies a plus voltage to the FET 23 that is turned on and applies a GND voltage to the FET 24 that is turned off. In FIG. 4, as specific values, +8.2V is applied to the FET 23 that is turned on and 0V is applied t the FET 24 that is turned off. In this case, the voltage of the point A, to which the source or the drain of the FET 23 and the source or the drain of the FET 24 are connected, is determined via the parasitic diode D generated between the gates and sources, and between the gates and drains of the FETs. To be more specific, as the voltage of the gate resistance terminal of the FET 23 is +8.2V, and the voltage of the gate resistance terminal of the FET 24 is 0V, the voltage of the point A is determined by the current that passes through the parasitic diode D of the FET 23 from the resistor Rg 23 in the forward direction, and the parasitic diode D of the FET 24 in the reverse direction to the resistor Rg 24.

From the voltage to current characteristics of the diode, the voltage of the point A is determined by the resistor Rg 23 of the ON side FET 23 and the parasitic diode D of the FET 23. In FIG. 4, a specific value of the voltage of the point A is specified as +7V. The operation state of the FET 23 and FET 24 is considered again hereinafter. As a plus voltage is applied between the gate and the source, and between the gate and the drain of the FET 23, the FET 23 is turned on. A minus voltage is applied between the gate and the source, and the gate and the drain of the FET 24, thus the FET 24 is turned off.

From the above operation, by the positive voltage DCDC converter with logic 40 to control the voltage to be applied to a gate resistor of the FET switch, the FET switch can be turned on or off. However, a plus voltage corresponding to the voltage applied to the gate resistor of the ON side FET appears in the connection point A for the FET switches. The voltage of the point A appears in the source and drain terminals of the FETs via the resistors R that are connected between the sources and the drains of the FETs. Therefore, in order to filter out the current flowing into the output terminals OUT1 and OUT2 from the point A, capacitances for filtering out DC C23 and C24 are provided between the FET 23 and FET 24, and the output terminals OUT1 and OUT2.

As described so far, the level shift circuit according to this exemplary embodiment can be incorporated o various known switching circuits like the switching circuit 100 illustrated in FIG. 4. Note that this switching circuit can be incorporated to a transmission and receiving unit of a cellular phone terminal or the like.

Figure 5:
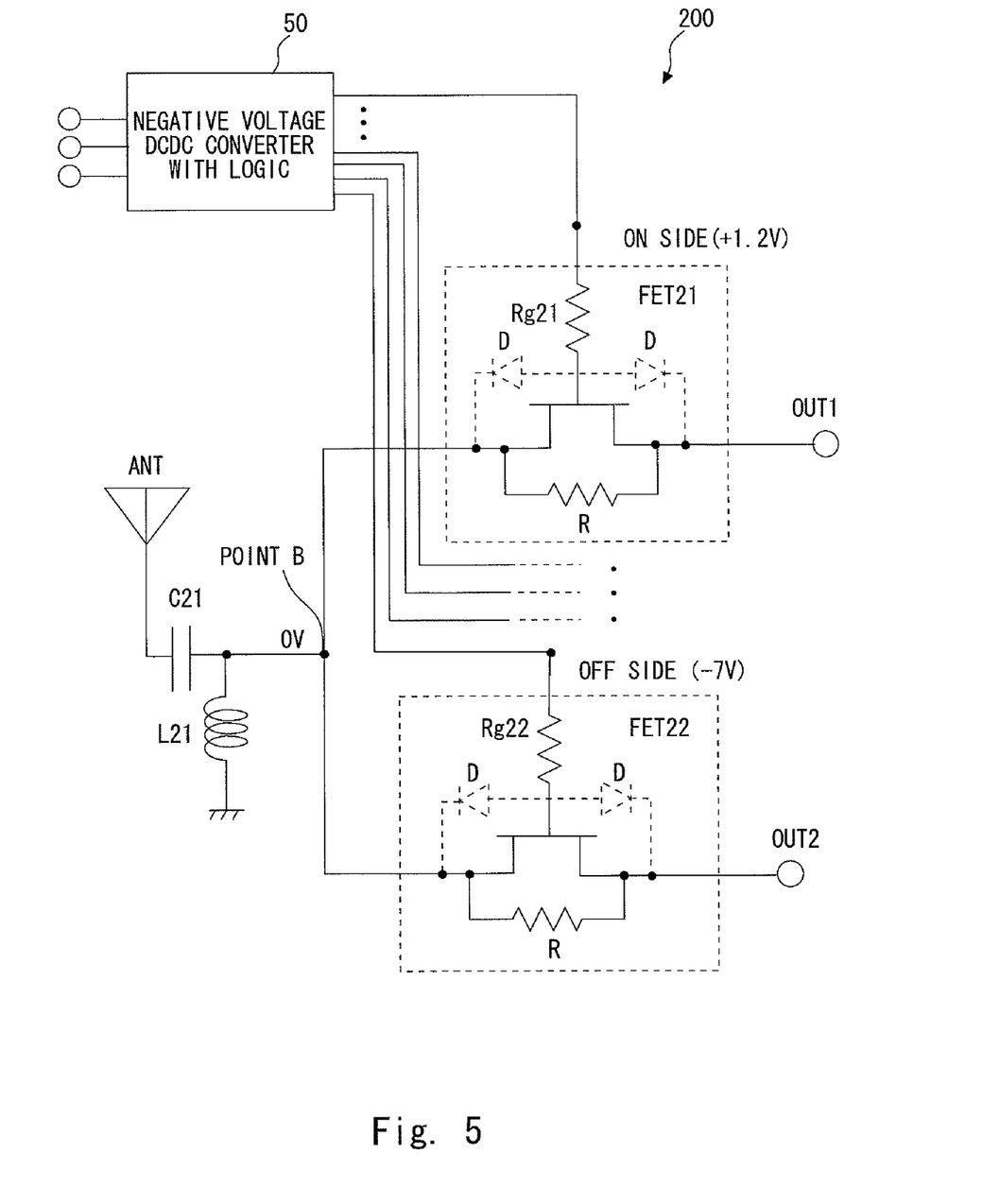
FIG. 5 illustrates the configuration of a switching circuit incorporating the level shift circuit of the exemplary embodiment to a negative voltage DCDC converter.

Next, another application example of the level shift circuit according to this exemplary embodiment is explained. FIG. 5 illustrates the configuration of a switching circuit 200 incorporating the level shift circuit of the above exemplary embodiment. In the switching circuit 200, a signal received by an antenna (input terminal) ANT is input to a point B via a high pass filter composed of a capacitor C21 and an inductor L21. The signal of this point B is output to output terminals OUT1 and OUT2 via multiple FET switches. The switching circuit 200 is provided with a negative voltage DCDC converter with logic 50 and multiple FET switches. The negative voltage DCDC converter with logic 50 is controls ON/OFF of the multiple FET switches that are composed of FET 21 and FET 22. The negative voltage DCDC converter with 50 is provided with the level shift circuit (not illustrated) according to the exemplary embodiment of the present invention. The level shift circuit generates a control signal that controls ON/OFF of the multiple FET switches.

FIG. 5 illustrates the case in which the FET 21, that includes a gate resistor Rg 21 connected to a gate and a resistor connected between a source and a drain, is turned on, and the FET 22, that includes a gate resistor Rg 22 connected to a gate and a resistor connected between a source and a drain, is turned off. The DCDC converter that applies a voltage to gate resistance terminals of the FET 21 and FET 22 applies a plus voltage to the FET 21 that is turned on and applies a minus voltage to the FET 22 that is turned off.

In FIG. 5, as specific values, +1.2V is applied to the FET 21 that is turned on, and −7V is applied to the FET 22 that is turned off. At this time, the voltage of the point B, to which the source of the drain of the FET 21 and the source or the drain of the FET 22 are connected, is determined by parasitic diodes generated between the gates and sources, and the gates and drains of the FET. To be more specific, the voltage of the gate resistance terminal of the FET 21 is +1.2V, and the voltage of the gate resistance terminal of the FET 22 is −7V. Thus the voltage of the point B is determined by a current that passes through the parasitic diode D of the FET 21 from the resistor Rg21 in the forward direction to the inductor L21. As the resistance component of the inductor L21 is smaller enough than the resistor 21, the potential of the point B is a GND potential.

The operation state of the FET 21 and FET 22 is considered again hereinafter. As a plus voltage is applied between the gate and the source, and between the gate and drain of the FET 21, the FET 21 is turned on. A minus voltage is applied between the gate and source, and between the gate and drain of the FET 22, thus the FET 22 is turned off. By controlling the voltage applied to the gate resistor of the FET switch, the FET switch can be turned on and off. This operation is the same operation as the switching circuit 100 of FIG. 4 that is provided with the positive voltage DCDC converter 40. However the potential of the point B, a connection point of the FET switches, is GND and the potentials of the source and drain terminals of the FET are also GND. Therefore, in the switching circuit 200 illustrated in FIG. 5, capacitances for filtering out DC are unnecessary for the output terminals OUT1 and OUT2. Thus the switching circuit 200 has advantages over the switching circuit 100 of FIG. 4 in terms of less area and cost required for the capacitances for filtering out DC.

The present invention is not limited to the above exemplary embodiment, but may be modified as appropriate in the scope of the present invention.

For example, the second switching unit, which is configured with the E mode FET E3 in the FIG. 1, may be configured with a logic gate including multiple stages of transistors. When the second switching unit is configured with the logic gate, the second switching unit is controlled by more than two control signals.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A level shift circuit that converts input signal levels into a level between a first voltage and a second voltage which is higher than the first voltage, the level shift circuit comprising: a select circuit that generates an oscillation signal according to the input signal, at least one of a frequency and an amplitude of the oscillation signal changing; a filter circuit that removes a DC component of the oscillation signal output from the select circuit and outputs an AC component; a detect circuit that operates between the first voltage and an output side voltage of the filter circuit and generates a control signal having a signal voltage that changes according to a change of at least one of the frequency and the amplitude in the AC component of the oscillation signal; and an output circuit that generates an output signal according to the control signal, the output signal having a level between the first voltage and the second voltage, wherein the select circuit comprises: a first switching unit that generates the oscillation signal; a second switching unit connected in series with the first switching unit; and a third switching unit wherein: the first switching unit generates the oscillation signal based on an on or off state of the second switching unit, one of the second switching unit and the third switching unit receives an input control signal, and the other one of the second switching unit and the third switching unit receives an inverted input control signal.

2. The level shift circuit according to claim 1, wherein the first voltage is generated by a charge pump circuit.

3. The level shift circuit according to claim 1, wherein the detect circuit filters out a current component that is lower than the first voltage from the AC component of the oscillation signal input via the filter circuit and generates the control signal according to a current component that is higher than the first voltage.

4. The level shift circuit according to claim 1, wherein the second switching unit is one transistor.

5. The level shift circuit according to claim 1, wherein the second switching unit is a logic gate having a plurality of transistors.

6. The level shift circuit according to claim 1, wherein
the select circuit is turned on and off according to an inverted signal of the input control signal, and
the select circuit comprises a shunt circuit for filtering out noise input to the detect circuit.

7. The level shift circuit according to claim 1, wherein the first transistor and the second transistor are enhancement mode FETs.

8. The level shift circuit according to claim 1, wherein the second voltage is a power supply voltage or an internal generation voltage.

9. A switching circuit comprising:
the level shift circuit according to claim 1; and
a switch that selectively outputs a signal input from an input terminal to an output terminal according to a control signal output from the level shift circuit.

10. The switching circuit according to claim 9, wherein
the switching circuit comprises a plurality of the switches; and
the level shift circuit generates a control signal that controls the plurality of switches according to a signal being input.

11. The switching circuit according to claim 9, further comprising a capacitor disposed between the switch and the output terminal.

12. A level shift circuit that generates an output voltage between a first voltage and a second voltage which is higher than the first voltage, the level shift circuit comprising: a select circuit that receives as input a first time varying signal and outputs a second time varying signal or a constant voltage according to an input control signal; a filter circuit that receives as input the second time varying signal or the constant voltage and outputs an AC component in the received input by removing a DC component in the received input; a detect circuit that receives as input the signal output by the filter circuit and generates an output control signal having a first value if the select circuit outputs a constant voltage and having a second value, higher then the first value, if the select circuit outputs the second time varying signal; and an output circuit that receives as input the output control signal generated by the detect circuit and generates the output voltage between the first voltage and the second voltage, wherein the select circuit comprises: a first switching unit that generates the second time varying signal; a second switching unit connected in series with the first switching unit; and a third switching unit, wherein: the first switching unit generates the second time varying signal based on an on or off state of the second switching unit, one of the second switching unit and the third switching unit receives the input control signal, and the other one of the second switching unit and the third switching unit receives an inverted input control signal.

* * * * *